US010814394B2

(12) United States Patent
Herzog

(10) Patent No.: US 10,814,394 B2
(45) Date of Patent: Oct. 27, 2020

(54) METHOD FOR PRODUCING INJECTION MOLDING ELEMENT BY ADDITIVE MANUFACTURING

(71) Applicant: CL SCHUTZRECHTSVERWALTUNGS GMBH, Lichtenfels (DE)

(72) Inventor: Frank Herzog, Lichtenfels (DE)

(73) Assignee: CONCEPT LASER GMBH, Lichtenfels (DE)

( * ) Notice: Subject to any disclaimer, the term of this patent is extended or adjusted under 35 U.S.C. 154(b) by 20 days.

(21) Appl. No.: 15/749,477

(22) PCT Filed: Aug. 4, 2016

(86) PCT No.: PCT/DE2016/100356
§ 371 (c)(1),
(2) Date: Jan. 31, 2018

(87) PCT Pub. No.: WO2017/020894
PCT Pub. Date: Feb. 9, 2017

(65) Prior Publication Data
US 2018/0210984 A1  Jul. 26, 2018

(30) Foreign Application Priority Data
Aug. 6, 2015  (DE) .......... 10 2015 112 918

(51) Int. Cl.
*B22F 5/00* (2006.01)
*B22F 3/105* (2006.01)
(Continued)

(52) U.S. Cl.
CPC .......... *B22F 3/1055* (2013.01); *B22F 5/007* (2013.01); *B22F 5/10* (2013.01); *B29C 33/04* (2013.01);
(Continued)

(58) Field of Classification Search
None
See application file for complete search history.

(56) References Cited

U.S. PATENT DOCUMENTS 5,775,402 A * 7/1998 Sachs ............... B22C 9/065
164/4.1
6,145,804 A * 11/2000 Baumann ......... B29C 33/046
249/79
(Continued)

FOREIGN PATENT DOCUMENTS

DE   102012005276 A1   9/2013
DE   102013212803 A1   1/2015
(Continued)

OTHER PUBLICATIONS

Mirko Bromberger: "Additive Manufacturing Design & Engineering Symposium Paradigmenwechsel in der Konstruktion and Entwicklung Innovation Intelligence", Nov. 25, 2014
(Continued)

*Primary Examiner* — Bernard G Lindsay
(74) *Attorney, Agent, or Firm* — Dority & Manning, P.A.

(57) ABSTRACT

A method for producing a three-dimensional object includes specifying reference-object information which describes data of a reference object, determining load information which describes at least one load value in a specific load situation inside the reference object described by the reference-object information, determining load regions having load values that deviate from a reference-load value inside the reference object described by the reference-object information, on the basis of the load information, determining object information which describes geometrically structural data of the object to be produced, on the basis of the load information and of the boundary condition information, and producing the three-dimensional object.

11 Claims, 4 Drawing Sheets

Figure 1:
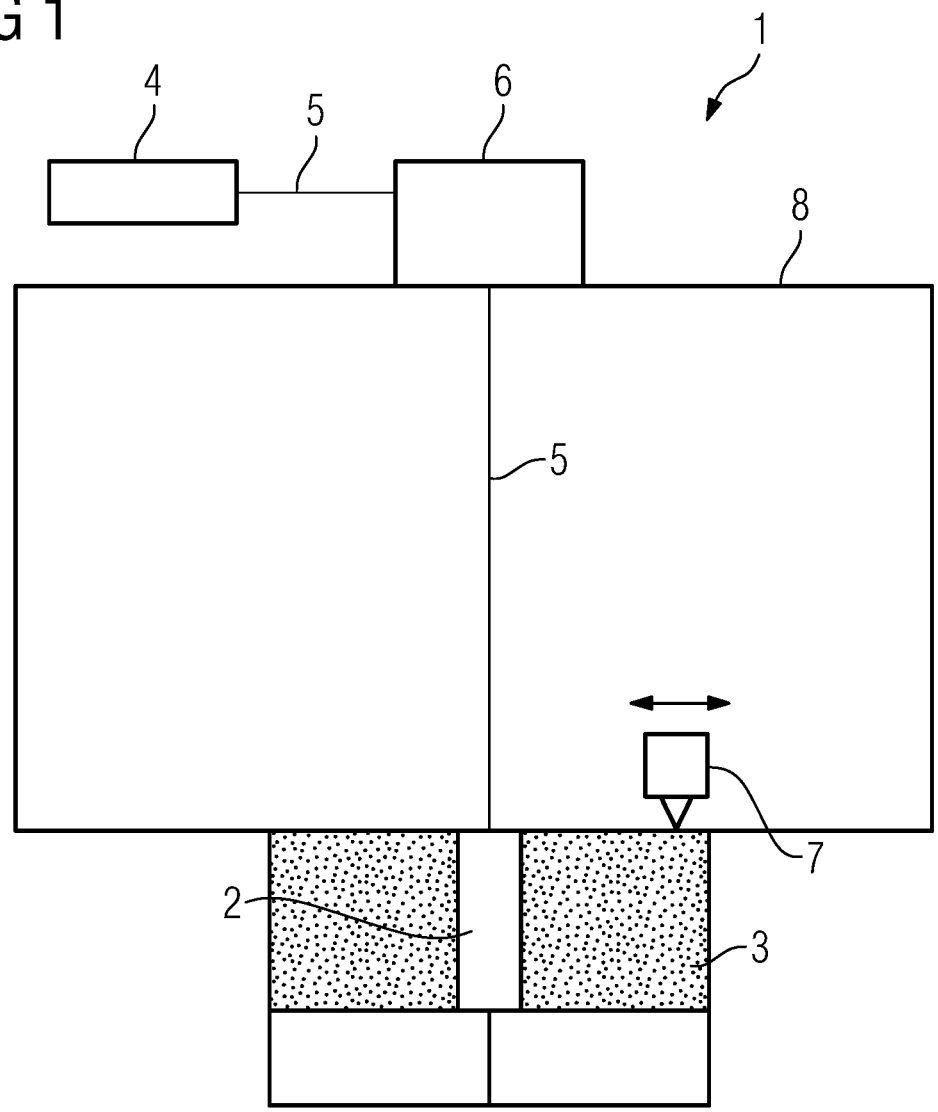

(51) Int. Cl.

| | |
|---|---|
| *B29C 33/04* | (2006.01) |
| *B29C 33/38* | (2006.01) |
| *G06F 30/23* | (2020.01) |
| *B29C 64/153* | (2017.01) |
| *B29C 64/393* | (2017.01) |
| *B22F 5/10* | (2006.01) |
| *B33Y 10/00* | (2015.01) |
| *B33Y 30/00* | (2015.01) |
| *B29C 45/33* | (2006.01) |

(52) U.S. Cl.
CPC ........ *B29C 33/3842* (2013.01); *B29C 64/153* (2017.08); *B29C 64/393* (2017.08); *G06F 30/23* (2020.01); *B22F 2003/1057* (2013.01); *B29C 45/33* (2013.01); *B33Y 10/00* (2014.12); *B33Y 30/00* (2014.12); *Y02P 10/292* (2015.11); *Y02P 10/295* (2015.11)

(56) References Cited

U.S. PATENT DOCUMENTS

| | | | |
|---|---|---|---|
| 10,035,188 B2 | 7/2018 | Weilhammer et al. | |
| 2002/0042663 A1* | 4/2002 | St. Ville | G06F 30/23 700/98 |
| 2008/0290215 A1* | 11/2008 | Udall | F01D 5/147 244/123.14 |
| 2014/0277669 A1* | 9/2014 | Nardi | G05B 19/042 700/103 |
| 2015/0003995 A1 | 1/2015 | Xu | |
| 2015/0093283 A1 | 4/2015 | Miller et al. | |
| 2015/0190971 A1 | 7/2015 | Musuvathy et al. | |
| 2016/0051009 A1* | 2/2016 | Kormann | B22F 3/1055 36/103 |

FOREIGN PATENT DOCUMENTS

| | | |
|---|---|---|
| DE | 102013220983 A1 | 4/2015 |
| EP | 2586548 A1 | 5/2013 |
| EP | 2778992 A1 | 9/2014 |
| EP | 2875928 A1 | 5/2015 |
| JP | 2005169766 A | 6/2005 |
| JP | 2014197393 A | 10/2014 |
| JP | 2015512762 A | 4/2015 |

OTHER PUBLICATIONS

Chinese Office Action Corresponding to Application No. 2016800249859.
International Search Opinion Corresponding to PCT Application No. PCT/DE2016100356 dated Aug. 4, 2016.
International Search Results Corresponding to PCT Application No. PCT/DE2016100356 dated Jan. 23, 2017.
Chinese Search Results Corresponding to Application No. 2016800249859 dated Oct. 30, 2017.
German Search Results Corresponding to Application No. 102015112918 dated Nov. 5, 2018.
German Office Action Corresponding to Application No. 102015112918 dated May 22, 2019.
Japanese Office Action Corresponding to Application No. 2017559564 dated Aug. 13, 2019.

* cited by examiner

METHOD FOR PRODUCING INJECTION MOLDING ELEMENT BY ADDITIVE MANUFACTURING

CROSS-REFERENCE TO RELATED APPLICATIONS

This application is a United States national stage entry of an International Application serial no. PCT/DE2016/100356 filed Aug. 4, 2016 which claims priority to German Patent Application serial no. 10 2015 112 918.3 filed Aug. 6, 2015. The contents of these applications are incorporated herein by reference in their entirety as if set forth verbatim.

The invention relates to a method for the manufacture of a three-dimensional object.

A large number of different versions of methods for the manufacture of three-dimensional objects, such as engineering objects, are known to the prior art.

Methods for the additive manufacture of three-dimensional objects are continuing to grow in importance. Three-dimensional objects to be manufactured in this way are additively constructed through successive, selective fusing in layers of a fusible construction material in regions corresponding to respective cross-sectional regions of the particular object to be manufactured by means of an energy beam generated by a radiation generation device.

The geometrically structural design, including in particular the weight, of three-dimensional objects manufactured using known methods is, as a rule, specified by geometrically structural data defined before the manufacture itself. An optimization of the geometrically structural design of the object concerned, for example on the basis of loads actually acting on the manufactured object in an object-specific field of application or use, typically does not take place in the context of such methods.

The invention is based on the object of providing a method for the manufacture of a three-dimensional object that is improved over the latter.

The object is achieved by a method as claimed. The dependent claims relate to advantageous forms of embodiment of the method. The object is furthermore achieved by an apparatus.

The method described herein serves in general to manufacture three-dimensional objects (referred to below more briefly as "objects"). The objects to be manufactured or that have been manufactured by means of the method are, at least in segments, constructed or manufactured additively. An object manufactured by means of the method can accordingly comprise object segments that are conventionally constructed, i.e. not additively, and object segments that are additively constructed. An object manufactured by means of the method can, of course, also be entirely additively constructed or manufactured, so that it exclusively comprises additively constructed object segments.

The additive construction, or the additive manufacture, of a corresponding object or object segment is based on a successive, selective fusing in layers of at least one fusible construction material in regions corresponding to respective cross-sectional regions of the particular object or object segment to be manufactured by means of at least one energy beam generated by at least one radiation generation device. The successive, selective fusing in layers of the fusible construction material takes place on the basis of the geometrically structural design, i.e. in particular on the layer-related cross-sectional geometries, of the structural data that describes the particular object or object segment to be manufactured. Corresponding structural data describes, in general, the geometrical, or geometrically structural form of the particular object or object segment to be additively manufactured.

A fusible construction material used in the context of the method can, for example, be a metal powder (mixture) that is fusible by means of a suitable energy beam and/or a plastic powder (mixture) that is fusible by means of a suitable energy beam. A suitable fusible construction material typically has the nature or form of a powder.

An energy beam used in the context of the method can, for example, be electromagnetic radiation, such as for example a laser beam, referred to more briefly as a laser. A radiation generation device used in the context of the method can thus be a laser generation device for generating a laser beam. In this case, the method can comprise, for example, a selective laser sintering method, known for short as an SLS method, for carrying out selective laser sintering processes for the additive manufacture of three-dimensional objects, or a selective laser melting method, known for short as an SLM method, for carrying out selective laser melting processes for the additive manufacture of three-dimensional objects. Electron or particle radiation can also be used instead of electromagnetic radiation in the context of the method. A radiation generation device used in the context of the method is thus an electron or particle generation device for the generation of an electron or particle beam.

The method comprises in general the following method steps:
  providing an item of reference object information describing in particular geometrically structural data of a reference object, and at least one item of boundary condition information describing at least one in particular geometrically structural boundary condition of the object to be manufactured,
  determining an item of load information describing at least one load value in at least one particular load situation within the reference object described by the reference object information,
  determining load regions with load values deviating from a specifiable or specified reference load value within the reference object described by the reference object information using the load information,
  determining an item of object information describing geometrically structural data of the three-dimensional object to be manufactured on the basis of the load information and of the boundary condition information,
  manufacturing the object to be manufactured on the basis of the object information, wherein the three-dimensional object to be manufactured, at least in load regions with load values deviating from the specifiable or specified reference load value, are additively manufactured through successive, selective fusing in layers of a fusible construction material.

In a first step of the method, an item of reference object information describing in particular geometrically structural data of a reference object, and at least one item of boundary condition information describing at least one in particular geometrically structural boundary condition of the object actually to be manufactured by means of the method is prepared or specified.

The reference object information describes data of a reference object. Corresponding data contains in particular a specified geometrically constructive design, i.e. in particular a specified external contour of the reference object. The reference object information thus in particular describes the geometrically structural design of the reference object. The reference object information can, accordingly, describe design data, such as CAD data, of the reference object. The reference object typically represents an object corresponding to the general type of the object to be manufactured. If, as is explained in an example below, in the context of the method a tool element of an injection molding tool is, for example, manufactured, the reference object already represents a tool element of an injection molding tool.

The geometrically structural design, i.e. in particular also the mass, of the reference object, is typically specified with respect to an object-specific field of application or use. Corresponding geometrically structural data of the reference object described by the reference object information contains a typically generic basic form, which is to be modified or optimized further in the process, of the object that is actually to be manufactured. The geometrically structural design of the reference object described by the reference object information thus deviates from the geometrically structural design of the object to be manufactured, and vice versa. Particular geometrically structural parameters of the object to be manufactured can accordingly be in accord with particular geometrically structural parameters of the reference object, while other geometrically structural parameters of the object to be manufactured can deviate from particular geometrically structural parameters of the reference object. It is, naturally, also possible for all the geometrically structural parameters of the object to be manufactured to deviate from the geometrically structural parameters of the reference object.

In concrete terms, an item of reference object information can, for example, describe a solidly constructed reference object with specified external dimensions or a specified external contour. The external dimensions or the external contour, i.e. (to a large extent) the external form of the object to be manufactured deviates, as will be seen later, due to the nature of the method at least in sections, and possibly entirely, from the external dimensions or the external contour, i.e. (to a large extent) the external form of the reference object. To the extent that the external form of the object to be manufactured does not deviate entirely from the external form of the reference object, the external dimensions or the external contour, i.e. (to a large extent) the external form of the object to be manufactured correspond at least in sections to the external dimensions or the external contour, i.e. (to a large extent) the external form of the reference object.

As explained, in addition to the reference object information, at least one item of boundary condition information is also prepared or specified. The boundary condition information describes a variety of boundary conditions affecting the object to be manufactured. Boundary conditions can be geometrically structural parameters or structural-physical parameters or properties of the object to be manufactured. Particular geometrically structural parameters or particular structural-physical parameters or properties can accordingly be specified through the boundary condition information, which should (necessarily) be given at least at one object segment of the object to be manufactured, or at the entire object to be manufactured.

Corresponding boundary conditions can define at least one geometrically structural parameter of at least one external (exposed) object segment of the object to be manufactured, such as a surface, a side face, a bottom face etc., and/or at least one internal (not exposed) object segment of the object to be manufactured, or geometrically structural parameters of the entire object to be manufactured. Typically, corresponding geometrically structural parameters define at least the external dimensions or the external contour, i.e. (to a large extent) the external form of at least one object segment of the object to be manufactured or of the entire object to be manufactured.

Corresponding boundary conditions can, alternatively or in addition, define at least one structural-physical parameter of at least one external (exposed) object segment of the object to be manufactured and/or at least one internal (not exposed) object segment of the object to be manufactured or at least one structural-physical parameter of the entire object to be manufactured. Corresponding structural-physical parameters are, in particular, mechanical parameters such as mass, density, hardness, strength or bending strength, stiffness or bending stiffness, elasticity, plasticity (ductility), toughness and/or tribological parameters such as the coefficient of friction, resistance to wear and/or optical-acoustic parameters such as light and/or sound absorption or light and/or sound reflection, and/or thermal parameters such as thermal expansion, thermal conductivity, (specific) heat capacity, high-temperature strength, low-temperature toughness and/or electrical parameters such as electrical conductivity, electrical resistance, of at least one object segment of the object to be manufactured or of the entire object to be manufactured.

Examples of specific boundary condition information are given below:

An item of boundary condition information can, for example, describe at least one non-changeable two-dimensional or three-dimensional region of the object that is to be manufactured in view of the geometrically structural data of the reference object described by the reference object information. The object to be manufactured can then be manufactured with a region corresponding to the non-changeable region described by the boundary condition information. The geometrically structural design of the object here agrees to that extent with the geometrically structural design of the reference object.

An item of boundary condition information can, furthermore, describe a closed external contour of the object to be manufactured. The object to be manufactured can then be manufactured with a closed external contour corresponding to the closed external contour described by the boundary condition information. The geometrically structural design of the object here agrees to that extent with the geometrically structural design of the reference object.

An item of boundary condition information can, furthermore, describe at least one external and/or internal region that is to have solid form, of the object to be manufactured. The object to be manufactured can then be manufactured with an external and/or internal region that is to have solid form, corresponding to the external and/or internal region that is to have solid form described by the boundary condition information. The geometrically structural design of the object here agrees to that extent with the geometrically structural design of the reference object.

An item of boundary condition information can, furthermore, describe at least one object-specific functional element in view of a use as intended of the object to be manufactured, for example a connecting region or a connecting element for connecting the object to a further object. The object to be manufactured can then be manufactured with a functional element corresponding to the at least one functional element described by the boundary condition information. The geometrically structural design of the object here agrees at least to that extent with the geometrically structural design of the reference object. In this way it is possible to ensure that the manufactured object can be connected as intended with further objects, i.e. in particular be inserted into further objects.

In a second step of the method that follows the first step, an item of load information describing at least one load value in at least one particular load situation, in particular at least one load situation in which the object to be manufactured is being used as intended, is determined within the reference object described by the reference object information. The load information accordingly describes load values which at least one reference object segment, or the entire reference object, experiences in particular load situations, and thus the behavior ("load behavior") of at least one reference object segment or of the entire reference object in particular load situations. In corresponding load situations this can, for example, involve load scenarios in accordance with intended use of the object to be manufactured, i.e. load situations to which the object to be manufactured is typically exposed when used as intended. It is, of course, also possible that corresponding load situations involve load scenarios that are generated independently of the use of the object to be manufactured in accordance with intended use.

The load information can, in general, describe a mechanical and/or a climatic and/or a fluidic and/or a thermal load situation, in particular when the object to be manufactured is used as intended. A corresponding load situation can also contain an at least partial distribution of respective loads within the object.

The load information can be prepared through suitable algorithms, for example by means of a computer-based simulation, e.g. a finite element method ("FEM") simulation. In other words, the load information can contain data of a simulation, e.g. an FEM simulation.

In a third step of the method following the second step, load regions with load values deviating from a specifiable or specified reference load value within the reference object described by the reference object information are determined using the load information or in the load information. The load values determined in the second step of the method within the at least one reference object segment or within the entire reference object in the load situation under consideration in each case are accordingly compared individually, in groups, or as a whole with at least one reference load value. It is thus in particular determined through matching or comparison whether corresponding load values within the at least one reference object segment or within the entire reference object are located above or below a corresponding reference load value, and thus exceed or fall short of a corresponding reference load value. A reference load value can refer to an upper and/or lower load limit value. Upper or lower load limit values are typically defined through object-specific, and in particular material-specific, characteristic parameters.

The determination of corresponding load regions with load values deviating from a reference load value within the reference object described by the reference object information using the load information or in the load information can be performed using suitable algorithms, for example by means of a computer-based simulation, e.g. an FEM simulation.

In a fourth step of the method following the third step, an item of object information describing geometrically structural data of the object to be manufactured is determined on the basis of the load information and of the boundary condition information. Corresponding geometrically structural data contains in particular the geometrically structural design of the object to be manufactured. The object information thus in particular describes the geometrically structural design of the object to be manufactured. Boundary conditions described by the boundary condition information, i.e., for example, geometrically structural parameters of the object that necessarily must be provided at the object to be manufactured, such as for example a necessary geometrically structural external form and/or structural-physical parameters that necessarily must be provided at the object to be manufactured such as for example essential mechanical properties of the object, a maximum weight of the object etc., are incorporated in the geometrically structural design of the object to be manufactured. The load values described by the load information are, equally, incorporated in the object information.

The object information can, accordingly, describe design data, such as CAD data, of the object to be manufactured. This design data is typically converted into the geometrically structural form, i.e. in particular the layer-related cross-sectional geometries, of the structural data describing the particular object or object segment to be manufactured.

In a fifth step of the method following the fourth step, the object to be manufactured is manufactured on the basis of the object information. The object to be manufactured here, at least in those load regions with load values deviating from the reference load value, is additively manufactured through successive, selective fusing in layers of a fusible construction material. At least those regions of the object to be manufactured or that have been manufactured that correspond to the determined load regions of the reference object in which load values deviate from corresponding reference load values, i.e. which fall short of or exceed them, are accordingly additively constructed. As explained, the entire object can, of course, also be additively constructed.

Through the additive construction of at least particular regions of the object to be manufactured or which has been manufactured that correspond to the load regions of the reference object in which load values deviate from corresponding reference load values, special external and/or internal structures that are relevant to the respective deviation of the respective load values from corresponding reference load values can be formed in these additively constructed regions of the object. This principle is illustrated by way of example with reference to the following examples:

In regions of the object that correspond to corresponding load regions of the reference object where specific mechanical reference load values, e.g. lower limit values such as for example a minimum stiffness are fallen short of, structures that bring about a (local) mechanical reinforcement, e.g. a mechanical stiffening, of the object can specifically be additively formed. In regions of the object that correspond to corresponding load regions of the reference object where specific mechanical reference load values, e.g. upper limit values, are already exceeded, structures that bring about e.g. a (local) reduction in weight or material (in comparison to a solid design of the object) can specifically be additively formed.

In regions of the object that correspond to corresponding load regions of the reference object where specific thermal reference load values, e.g. upper limit values, such as for example a maximum operating temperature, are exceeded, tempering channel structures that permit a (local) tempering, cooling in this case, of the object can specifically be additively formed. In regions of the object that correspond to corresponding load regions of the reference object where specific thermal reference load values, e.g. lower limit values, such as for example a minimum operating temperature, are fallen below, tempering channel structures that permit a (local) tempering, heating in this case, of the object can specifically be additively formed.

With reference to the examples, it is possible to recognize a particular advantage of the method, which in this way allows certain object segments, or the entire object, particularly in the light of particular load situations of the object, to be specifically additively manufactured, i.e. in particular with additively formed structures. The construction of respective object segments, or of the object, is based on the prior determination of specific load regions in the reference object which, as described, are evaluated with respect to particular reference load values, i.e. are compared with the corresponding reference load values. In this way it is possible—with reference to a specific load situation—for regions to be determined which can be formed with a view to the specific load situation in a particular manner, i.e. for example with particular structures, i.e. in particular in an optimized manner. This can, as explained, refer, for example, to a formation of mechanical reinforcing structures and/or a formation of mechanical weakening structures, i.e. for example structures that save weight or material, and/or a formation of tempering channel structures, etc.

The object to be manufactured can thus be optimized with a view to a particular application situation or a particular load situation, which significantly improves the structural properties of the object from various points of view, e.g. mechanical stability, weight, etc. It is here, in particular, possible for an appropriate optimization to take place only in the interior of the object. The external dimensions, or the external contour, i.e. (to a large extent) the external shape of the object can be retained (as compared with the reference object).

A further advantage of the method is that three-dimensional objects to be manufactured according to the method can be entirely additively constructed. In particular with a view to the manufacture of engineering objects, i.e. for example tool elements for injection molding tools, such as for example tool insert elements, pusher elements etc., which until now have comprised a base object body to be held ready in a store, which in future are provided with at least one object segment formed additively on the base object body ("hybrid object)", storage space, storage time, storage work etc. can be saved through the direct, additive manufacture of the object.

A further advantage of the method is, accordingly, also the possibility of an economical handling of resources, i.e. in particular of construction material. A good or improved energy balance of the method ("$CO_2$ footprint") is possible in this way.

The method steps referred to above, or some of them, can be carried out immediately after one another. It is also conceivable that the method steps, or some of them, are not carried out immediately one after another, i.e. with other method steps and/or interruptions to the method in between them.

A form of embodiment of the method provides that in load regions with load values deviating from the reference load value, the object to be manufactured is manufactured with a lightweight structure comprising at least one lightweight construction element and additively constructed through successive, selective fusing in layers of the fusible construction material by means of the energy beam generated by the radiation generation device. Through the specific additive construction of suitable lightweight structures, the object can be specifically manufactured, in regions which correspond to corresponding load regions of the reference object which exceed or fall short of particular reference load values, with additively constructed structures which for example bring about a reduction in weight or material, for example through a (local) reduction in density. Lightweight structures are typically formed in regions of the object that are subject to very little mechanical stress. Through the additive construction of suitable lightweight structures, these can be formed in arbitrary geometrically structural designs, in particular cross-sectional geometries, and can extend in any desired way through the object.

A recess, a sandwich structure, a region with a density that is lower in comparison with other regions of the manufactured object, a region made of a fusible construction material having a lower density in comparison with another fusible construction material of the manufactured object, or a region with thinner walls in comparison with other regions of the manufactured object can, for example, be formed as the lightweight construction element of an appropriate lightweight structure. An appropriate sandwich structure typically consists of at least one layer of lower mechanical strength arranged or formed between at least two layers of higher mechanical strength. The layer of lower mechanical strength can, for example, be of cellular construction.

A further form of embodiment of the method provides that in load regions with load values deviating from the reference load value, the object to be manufactured is manufactured with a tempering channel structure, additively constructed through successive, selective fusing in layers of the fusible construction material by means of the energy beam generated by the radiation generation device, through which tempering channel structure a tempering medium, in general a tempering fluid (gas and/or liquid) for tempering the manufactured object can flow. A tempering channel structure comprises at least one tempering channel extending at least partially through at least one object segment. Through the specific additive construction of suitable tempering channel structures, the object can be specifically manufactured, in regions which correspond to corresponding (thermal) load regions of the reference object which fall short of or exceed particular (thermal) reference load values, with additively constructed structures which, when a tempering medium flows through them, bring about a tempering of the object. Tempering channel structures are typically formed in thermally stressed regions of the object. A targeted tempering, i.e. cooling or heating, of particular object segments or of the entire object can be achieved through suitable tempering channel structures. Through the additive construction of suitable tempering channel structures, these can be formed in arbitrary geometrically structural designs, in particular cross-sectional geometries, and can extend in any desired way, for example meandering, through the object.

A further form of embodiment of the method provides that in load regions with load values deviating from the reference load value, the object to be manufactured is manufactured with a reinforcing structure comprising at least one reinforcing element additively constructed through successive, selective fusing in layers of the fusible construction material by means of the energy beam generated by the radiation generation device. Through the specific additive construction of suitable reinforcing structures, generally corresponding structures for increasing the mechanical strength of the object, the object can be specifically manufactured, in regions which correspond to corresponding (mechanical) load regions of the reference object which exceed or fall short of particular (mechanical) reference load values, with additively constructed structures which, for example by way of a (local) reinforcement, bring about an increase in the mechanical strength of the object. Reinforcing structures are typically formed in mechanically stressed regions of the object. Through the additive construction of suitable reinforcing structures, these can be formed in arbitrary geometrically structural designs, in particular cross-sectional geometries, and can extend in any desired way through the object.

A ribbed element can, for example, be formed as a reinforcing construction element. A reinforcing structure can, for example, be formed as two-dimensional or three-dimensional longitudinal and/or transverse ribbing.

In general, additively formed structures, i.e. in particular lightweight structures and/or tempering channel structures and/or reinforcing structures and/or bionic structures can extend in two or three dimensions, in the form of a network in some cases, through at least one object segment or through the entire object. Suitable additively formed structures can extend (only) through the interior of the object, so that they are not visible from the outside. Suitable structures can, in addition to their respective original function, of course also affect (further) structural-physical properties of the object. This can, for example, be found in the case of a potentially three-dimensional ribbed structure inside the object, which on the one hand (in comparison to a solid formation) entails a reduction in material, and on the other hand a mechanical reinforcement of the object.

Suitable lightweight structures can of course be combined in any desired way with suitable tempering channel structures and/or with suitable reinforcing structures.

A further form of embodiment of the method provides that in load regions with load values deviating from the reference load value, the object to be manufactured is manufactured with a bionic structure that comprises at least one bionic element which describes at least one biological, in particular animal and/or vegetable structure, and/or is derived from at least one biological, in particular animal and/or vegetable structure, and which is additively constructed through successive, selective fusing in layers of the fusible construction material by means of the energy beam generated by the radiation generation device.

In the context of the method, having regard to particular requirements for properties or loading of the particular object to be manufactured, specific "biological paradigms" which have been proven in nature in identical, similar or comparable load situations, can be selected, if relevant, for example in the light of a concrete requirements for properties or loading of an object to be manufactured, modified and additively formed in the respective object to be manufactured or that has been manufactured. These "biological paradigms", modified if relevant, are described by bionic data. The bionic data thus describes biological structures and/or structures derived from biological structures.

The bionic data can be combined, in data terms, with further structural data of the respective object to be manufactured, where said further structural data does not describe any biological structures, so that the structural data on which the successive, selective fusing in layers of the respective fusible construction material is based (also) as a whole contains bionic data. The structures described in respective bionic data can thus be formed, at least in a modified form, in the respective object to be manufactured.

The structures described by the bionic data typically serve as design elements, and permit a specific influencing or adjusting of the or of specific properties of a respective object to be manufactured, in particular customized in respect of particular requirements for properties or loading. In other words, through the formation of appropriate biological structures, or structures derived from corresponding biological structures, in a particular object to be manufactured or that has been manufactured, specific properties of the respective object to be manufactured or that has been manufactured can be customized or influenced or adjusted in a targeted manner, particularly in respect of particular requirements for properties or loading. Through the formation of suitable biological structures or of structures derived from suitable biological structures in an object that is to be manufactured or has been manufactured, it is possible for example for the mechanical and/or thermal and/or flow properties to be influenced or adjusted in a targeted manner in respect of the mechanical and/or thermal stability of at least a region of a particular object that is to be manufactured or has been manufactured.

Biological structures derived from or modified from suitable biological structures refer to structures that do not reproduce a biological paradigm exactly as in nature, but in a form that is at least partially modified. In this connection, as an example, a skeleton of a wing of a bird, which comprises individual skeleton elements, i.e. in particular bones, in a particular number, arrangement, alignment etc. with specific geometrical dimensions, can be taken as a biological structure. A modification of this biological structure would, for example, be a change to the number and/or arrangement and/or alignment and/or the geometrical dimensions of at least one skeleton element. Similar considerations apply, of course, to all biological structures described by corresponding bionic data.

Biological structures can be animal and/or animal-generated structures and/or vegetable structures and/or vegetable-generated structures. Biological structures can also be structures derived or modified from animal and/or animal-generated and/or vegetable and/or vegetable-generated structures. In principle it is also conceivable that bionic data describes human structures and/or structures derived from human structures. In this connection it should, however, be noted that the bionic data is only a part of corresponding construction data, so that the structural data is not typically the basis for the additive manufacture of objects into an identical reconstruction of human structures, i.e. for example for tooth replacement.

Corresponding bionic data can, as explained, describe animal structures. In general, external and/or internal animal structures, in particular tissue structures and/or shell structures and/or skeleton structures and/or surface structures and/or cell structures can be used as animal structures. Animal structures can thus, for example, be external and/or internal shell structures and/or skeleton structures of an animal or of a part of an animal. By way of example in this connection, reference may be made to particular extremities or limbs or parts of particular extremities or limbs of a particular animal. A concrete example is the skeleton of the wing of a bird which, due to a particular number, arrangement, alignment and formation of particular bone structures exhibits special mechanical properties. Animal structures can also be surface structures of an animal. By way of example in this connection, reference may be made to particular fur, plumage, scale or skin structures of a particular animal. A concrete example is the scale structure of a shark, which, due to a particular arrangement and formation of individual scales, exhibits special flow properties amongst other things.

Corresponding bionic data can also describe animal-generated structures. In general, external and/or internal structures of an animal-generated object, i.e. for example an animal-generated construction and/or an animal-generated textile, in particular similar to a fabric or net, can be used as animal-generated structures. By way of example in this connection, reference may be made to particular animal-generated formations or parts of particular animal-generated formations. A concrete example is a net structure modeled on a spider-web structure created by spiders, a thread structure modeled on a silk thread structure created by silkworms, a building structure modeled on a termite building structure created by termites, or a honeycomb structure modeled on a honeycomb structure created by bees, each of which exhibits special mechanical and/or flow properties (in particular for the example of a termite building structure which typically exhibits a particular ventilation or cooling channel structure).

Corresponding bionic data can also describe vegetable structures. In general, external and/or internal vegetable structures, in particular tissue structures and/or vegetable skeleton structures and/or surface structures and/or cell structures can be used as vegetable structures. By way of example in this connection, reference may be made to particular vegetable formations or vegetable formation extensions or parts of particular vegetable formations or vegetable formation extensions. A concrete example is a branch or leaf structure of a particular plant which, due to a particular arrangement and formation of particular ribbed structures, i.e. a main rib extending in the longitudinal direction of the branch or leaf, with side ribs branching off from that, exhibits special mechanical properties. As explained, vegetable structures can also be surface structures of a plant. By way of example in this connection, reference may be made to particular surfaces of a leaf or stem structure of a particular plant. A concrete example is the imitation of a surface structure of the leaf of the lotus plant which, due to a particular micro-structuring or nano-structuring, exhibits particular properties that inhibit the adhesion of dirt particles or repel water.

Corresponding bionic data can also describe vegetable-generated structures. In general, external and/or internal structures of a vegetable-generated object, i.e. for example a vegetable-generated fruit, can be used as vegetable-generated structures.

By way of example in this connection, reference may be made to vegetable-generated formations or parts of particular vegetable-generated formations. A concrete example is a fibrous or textile structure modeled on a fibrous or textile structure generated by flax or hemp plants, which exhibits particular mechanical properties.

Corresponding bionic data can, of course, describe different animal structures and/or vegetable structures or different animal-generated structures and/or vegetable-generated structures.

The above-described structures, i.e. lightweight structures, tempering channel structures, reinforcing structures, can of course be additively formed on the basis of corresponding bionic data.

A concrete example of an object that can be manufactured or is to be manufactured by means of the method is a tool element of an injection molding tool, in particular a pusher element or a tool insert element. Accordingly, a corresponding tool element of an injection molding tool, for example, can be manufactured by means of the method.

The invention further relates to an apparatus for the additive manufacture of a three-dimensional object through selective fusing in layers of a fusible construction material by means of an energy beam generated by a radiation generation device. The apparatus is designed to carry out the above-described method. All the explanations made in connection with the method accordingly apply in a similar manner to the apparatus.

The invention is explained in more detail in terms of exemplary embodiments in the figures of the drawing. In the figures:

FIG. 1 shows an illustration of the principle of an apparatus for carrying out a method according to an exemplary embodiment of the invention; and FIGS. 2-7 show illustrations of the principle of a method step of a method according to one exemplary embodiment of the invention.

FIG. 1 shows an illustration of the principle of an apparatus 1 for carrying out a method according to an exemplary embodiment of the invention. The apparatus 1, and thereby the method that can be carried out with this, is used for the additive manufacture of a three-dimensional object 2, i.e., typically, an engineering component or an engineering component group, through successive, selective fusing in layers of a fusible construction material 3 by means of an energy beam 5 generated by a radiation generation device 4.

The successive, selective fusing in layers of the fusible construction material 3 is done in such a way that the energy beam 5 generated by the radiation generation device 4 is guided by a beam deflection device 6 in a targeted manner to regions, corresponding to particular cross-sectional geometries to be fused, layer-related in each case, of the object 2 to be manufactured, of a layer of construction material formed by means of a coating device 7, movably mounted as suggested by the horizontally aligned arrow, in a construction chamber 8 of the apparatus 1.

The selective fusing in layers of the fusible construction material 3, and accordingly the additive construction of the object 2, here takes place on a supporting device with a carrier mounted movably in a vertical direction. The carrier is, for example, mounted movably relative to the radiation generation device 4.

The energy beam 5 used is electromagnetic radiation, i.e. a laser beam, referred to more briefly as a laser. The radiation generation device 4 used is accordingly a laser generation device for generating a laser beam. The method can accordingly be a selective laser sintering method, known for short as an SLS method, for carrying out selective laser sintering processes for the additive manufacture of three-dimensional objects 2, or a selective laser melting method, known for short as an SLM method, for carrying out selective laser melting processes for the additive manufacture of three-dimensional objects 2.

The fusible construction material 3 used can, for example, be a metal powder (mixture) that is fusible by means of the energy beam 5, i.e. for example an aluminum or steel powder, and/or a plastic powder (mixture) that is fusible by means of the energy beam 5, i.e. for example a polyetheretherketone powder.

In addition to the above-described functional components, i.e. the radiation generation device 4, the beam deflection device 6, and the coating device 7, the apparatus 1 of course comprises further functional components which are not illustrated—since they are not important for the explanation of the principle described herein—which are typically necessary or useful for carrying out additive construction processes.

The selective fusing in layers of the fusible construction material 3 takes place on the basis of structural data. The structural data describes, in general, the geometrical, or geometrically structural form of the particular object 2 to be additively manufactured. The structural data is stored in at least one control device (not illustrated) belonging to the apparatus 1, which controls the respective additive construction process or the functional components of the apparatus 1 necessary for the respective additive construction process.

An exemplary embodiment of the method, in which an object 2 in the form of a tool pusher element for an injection molding tool is manufactured, is explained in more detail with reference to FIGS. 2-7.

Figure 2:
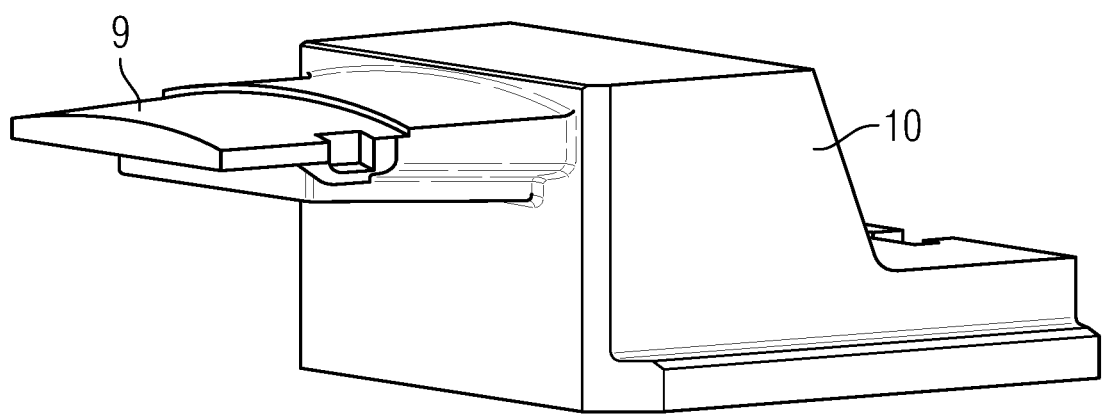

In the first step of the method, an item of reference object information describing data of a solidly constructed reference object illustrated in FIG. 2, and at least one item of boundary condition information describing an in particular geometrically structural boundary condition of the object 2 actually to be manufactured by means of the method, is prepared or provided. The reference object information describes data of the reference object.

Corresponding data contains a specified geometrically structural design, i.e. in particular a specified external contour, of the reference object. The reference object information accordingly describes the geometrically structural design of the reference object, i.e., in particular, design data, such as CAD data, of the reference object. The geometrically structural design, i.e. in particular also the mass, of the reference object is typically specified with respect to an object-specific field of application or use.

As explained, in addition to the reference object information, an item of boundary condition information is also prepared or specified. The boundary condition information describes a variety of boundary conditions affecting the object 2 to be manufactured. Boundary conditions can be geometrically structural parameters or structural-physical parameters or properties of the object 2 to be manufactured. Particular geometrically structural parameters or particular structural-physical parameters or properties are accordingly specified through the boundary condition information, which should (necessarily) be given at least at one object segment of the object 2 to be manufactured, or at the entire object 2 to be manufactured.

Corresponding boundary conditions define at least one geometrically structural parameter of at least one external (exposed) object segment of the object 2 to be manufactured, such as a surface, a side face, a bottom face etc., and/or at least one internal (not exposed) object segment of the object 2 to be manufactured, or geometrically structural parameters of the entire object 2 to be manufactured.

Corresponding boundary conditions can, alternatively or in addition, define at least one structural or physical parameter of at least one external (exposed) object segment of the object 2 to be manufactured and/or at least one internal (not exposed) object segment of the object 2 to be manufactured or at least one structural or physical parameter of the entire object to be manufactured. Corresponding structural or physical parameters are, in particular, mechanical parameters such as mass, density, hardness, strength or bending strength, stiffness or bending stiffness, elasticity, plasticity (ductility), toughness and/or tribological parameters such as the coefficient of friction, resistance to wear and/or optical-acoustic parameters such as light and/or sound absorption or light and/or sound reflection, and/or thermal parameters such as thermal expansion, thermal conductivity, (specific) heat capacity, high-temperature strength, low-temperature toughness and/or electrical parameters such as electrical conductivity, electrical resistance, of at least one object segment of the object to be manufactured or of the entire object 2 to be manufactured.

The boundary condition information can, for example, describe or define two-dimensional or three-dimensional regions of the object 2 to be manufactured that must not or cannot be changed in view of the geometrically structural data of the reference object described by the reference object information. The object 2 is then manufactured with regions corresponding to the non-changeable regions described by the boundary condition information.

The boundary condition information can, for example, describe or define a closed external contour of the object 2 to be manufactured. The object 2 is then manufactured with a closed external contour corresponding to the closed external contour described by the boundary condition information.

The boundary condition information can, furthermore, describe or define for example external and/or internal regions, which are to have solid form, of the object 2 to be manufactured. The object 2 is then manufactured external and/or internal regions that are to have solid form, corresponding to the external and/or internal regions that are to have solid form described by the boundary condition information.

The boundary condition information can, furthermore, describe or define at least one object-specific functional region or element in view of a use as intended of the object 2 to be manufactured, for example a connecting region or a connecting element for connecting the object 2 to a further object. The object 2 is then manufactured with a functional region or functional element corresponding to the at least one functional region or functional element described by the boundary condition information.

In the exemplary embodiment explained with reference to FIGS. 2-7, it is in particular described or defined by the boundary condition information that (i) a front tip 9 (shown in FIG. 2 at the corresponding object segments of the reference object) of the object 2 must be formed cohesively at least with the object segments 10, 11, (ii) the geometrically structural design of the object segment 11 must be retained, (iii) the (exposed) external faces of the object 2 must be closed, and (iv) the object 2 must not be shortened in its geometrically structural design in comparison with the reference object. It is furthermore defined through the boundary condition information that (v) the object 2 should be manufactured in such a way that mechanical loads acting on it when used as intended are absorbed, in particular as compressive loads, (vi) the region of the tip 9 of the object 2 must be provided with a tempering channel structure close to its contour, and (vii) all the object segments not necessary for the tempering of the object 2, in particular holes, may be removed.

Figure 3:
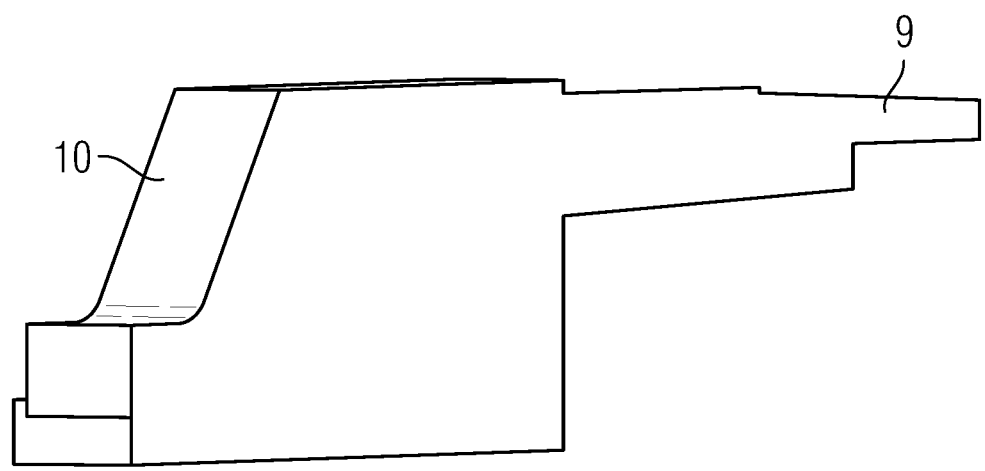

In a second step of the method that follows the first step, an item of load information describing at least one load value in at least one particular load situation within the reference object described by the reference object information is determined (cf. FIG. 3).

The load information describes load values which at least one reference object segment, or the entire reference object, experiences in particular load situations, and thus the behavior ("load behavior") of at least one reference object segment or of the entire reference object in particular load situations. In corresponding load situations this involves, for example, load scenarios in accordance with intended use of the object 2 to be manufactured, i.e. load situations to which the object 2 to be manufactured is typically exposed when used as intended.

The load information can, in general, describe a mechanical and/or a climatic and/or a fluidic and/or a thermal load situation, in particular when the object 2 to be manufactured is used as intended. The load information is prepared through suitable algorithms, for example by means of a computer-based simulation, e.g. an FEM simulation. In other words, the load information contains data of a simulation, e.g. an FEM simulation, cf. FIG. 3.

It can be seen from FIG. 3 that only a small proportion of the reference object is mechanically loaded under the given mechanical load situation. It can therefore be estimated with reference to FIG. 3 that a comparatively high potential for the reduction of construction material, and thus a comparatively high potential for the reduction of the weight of the object 2, is possible.

In a third step of the method following the second step, load regions with load values deviating from a specifiable or specified reference load value within the reference object are determined using the load information or in the load information. The load values determined in the second step of the method within the reference object in the load situation under consideration in each case are accordingly compared individually, in groups, or as a whole with at least one reference load value. It is thus determined through matching or comparison whether corresponding load values within the reference object are located above or below a corresponding reference load value. A reference load value can refer to an upper and/or lower load limit value. Upper or lower load limit values are typically defined through object-specific, and in particular material-specific, characteristic parameters.

The determination of corresponding load regions with load values deviating from a reference load value within the reference object with reference to the load information or in the load information is performed using suitable algorithms, for example by means of a computer-based simulation, e.g. an FEM simulation.

Figure 4:
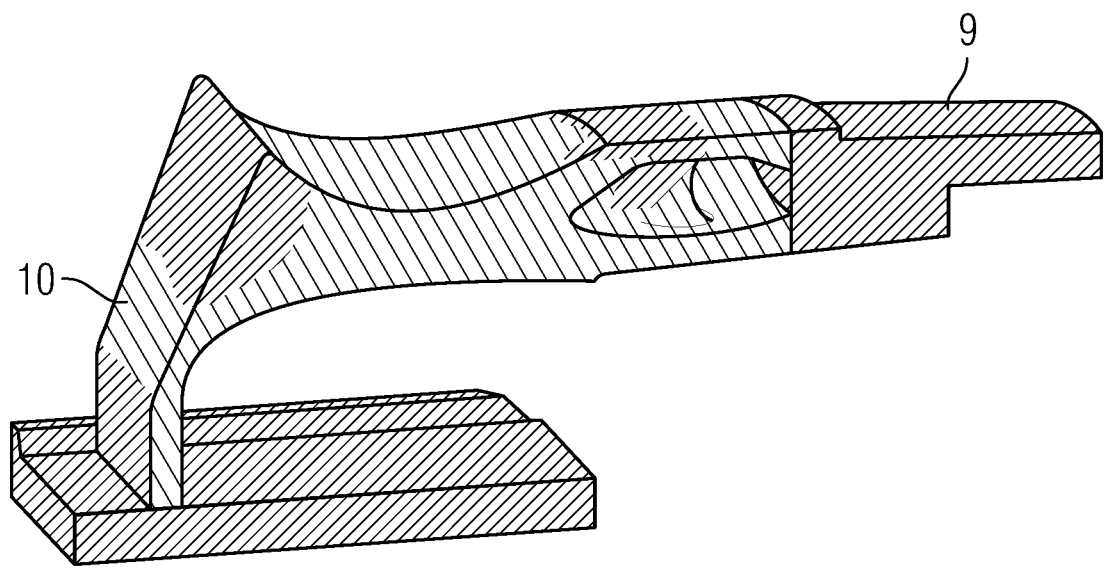
Figure 5:
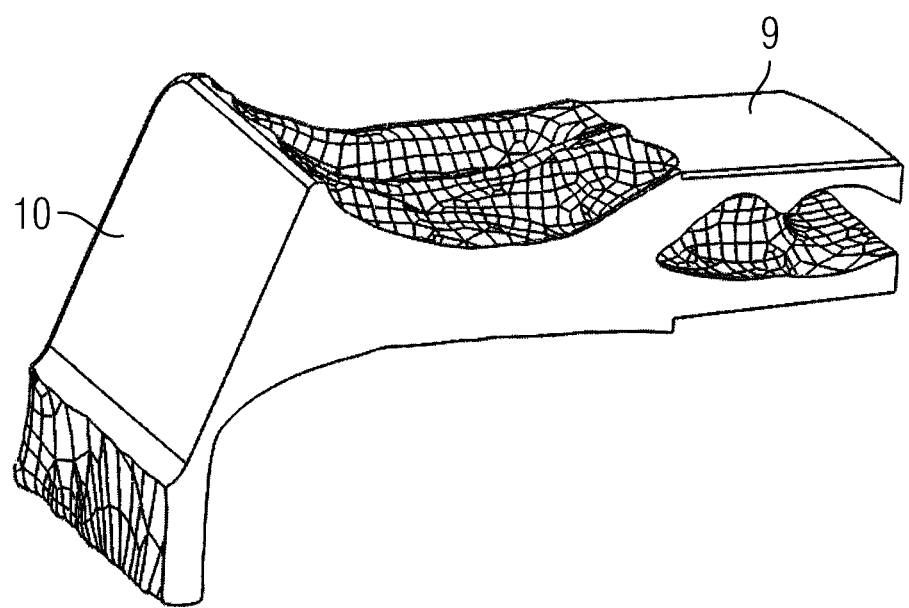

An FEM simulation of the of the geometrically structural design of the reference object after an adjustment of it to the load situation is shown in FIG. 4. The different hatchings show different loads. A corresponding CAD model is shown in FIG. 5. It can be seen that the geometrically structural design of the reference object has been changed significantly in comparison with that shown in FIG. 2. Although it is true that a significant reduction in weight or material is possible in this way, the above-mentioned boundary conditions are not, however, fulfilled.

In a fourth step of the method following the third step, an object information describing geometrically structural data of the the object 2 to be manufactured is determined on the basis of the load information and of the boundary condition information. Corresponding geometrically structural data contains the geometrically structural design of the object 2 to be manufactured, cf. FIG. 6. The boundary conditions described or defined by the boundary condition information are incorporated in the geometrically structural design of the object 2 to be manufactured. The load values described by the load information are, equally, incorporated in the object information.

Figure 6:
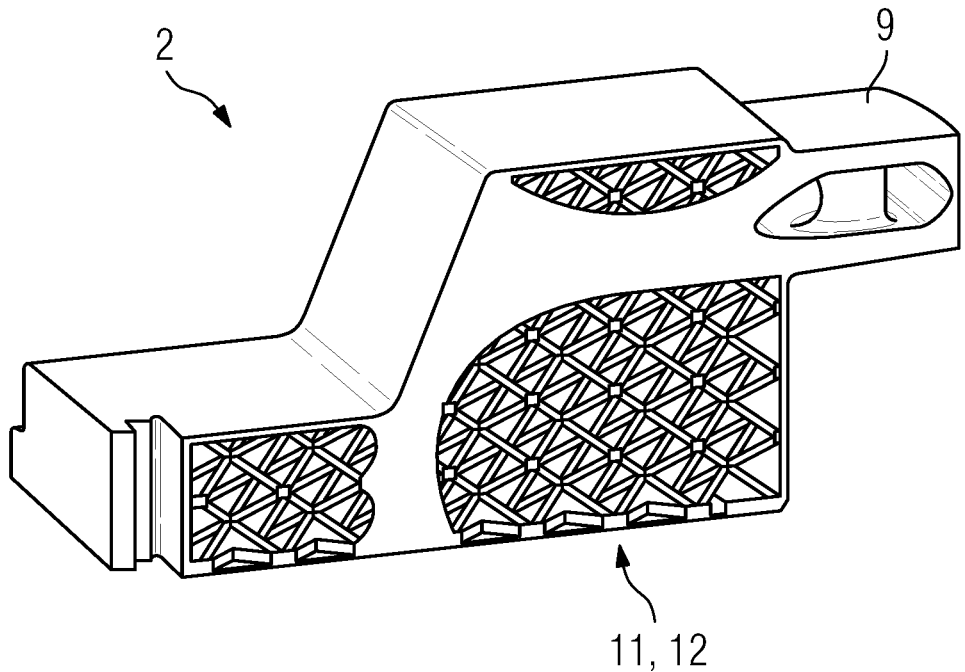

It can be seen in FIG. 6 that the object information describes design data, e.g. CAD data, of the object 2 to be manufactured. This design data is converted into the geometrically structural form, i.e. in particular the layer-related cross-sectional geometries, of the structural data describing the object 2 to be manufactured.

It can further be seen in FIG. 6 that in those regions of the object 2 to be manufactured that correspond to the load regions of the reference object in which load values deviate from corresponding reference load values, particular additively constructed external and/or internal structures are formed, which handle the respective deviation of the respective load values from corresponding reference load values.

In a fifth step of the method following the fourth step, the object 2 is manufactured on the basis of the object information. The object 2 is here, at least in those load regions with load values deviating from the reference load value, additively manufactured through successive, selective fusing in layers of a fusible construction material. In the exemplary embodiment, the entire object 2 is additively constructed.

In load regions with load values deviating from the reference load value, the object 2 is manufactured with an additively constructed lightweight structure 12 comprising at least one lightweight construction element. Through the specific additive construction of the lightweight structure 12, the object 2 is specifically manufactured, in regions which correspond to corresponding load regions of the reference object which exceed or fall short of particular reference load values, with additively constructed structures which bring about a reduction in weight or material through a (local) reduction in density. The lightweight structure 12 is formed in regions of the object 2 that are subject to very little mechanical stress. A recess, a sandwich structure, a region with a density that is lower in comparison with other regions of the manufactured object 2, a region made of a fusible construction material 3 having a lower density in comparison with another fusible construction material 3 of the manufactured object 2, or a region with thinner walls in comparison with other regions of the manufactured object 2 can, for example, be formed as the lightweight construction element of an appropriate lightweight structure 12.

In load regions with load values deviating from the reference load value, the object 2 is manufactured with an additively constructed tempering channel structure (not illustrated), through which a tempering medium for tempering the manufactured object 2 can flow. Through the specific additive construction of suitable tempering channel structures, the object 2 can be specifically manufactured, in regions which correspond to corresponding (thermal) load regions of the reference object which fall short of or exceed particular (thermal) reference load values, with additively constructed structures which, when a tempering medium flows through them, bring about a tempering of the object 2. Tempering channel structures are typically formed in thermally stressed regions of the object 2. A targeted tempering, i.e. cooling or heating, of the object 2 can be achieved through suitable tempering channel structures.

In load regions with load values deviating from the reference load value, the object 2 is manufactured with a reinforcing structure 13 comprising at least one additively constructed reinforcing element. Through the targeted additive construction of the reinforcing structure 1, the object 2 can be manufactured in a targeted manner, in regions which correspond to corresponding (mechanical) load regions of the reference object which fall short of exceed particular (mechanical) reference load values, with additively constructed structures which bring about an increase in the mechanical strength of the object 2 through a (local) reinforcement. A ribbed element can, for example, be formed as a reinforcing construction element, cf. FIG. 6. The reinforcing structure 12 can be formed three-dimensional longitudinal and/or transverse ribbing.

In load regions with load values deviating from the reference load value, the object 2 can be manufactured with an additively constructed bionic structure (not illustrated) that comprises at least one bionic element which describes at least one biological, in particular animal and/or vegetable structure, and/or is derived from at least one biological, in particular animal and/or vegetable structure. An animal structure, wherein external and/or internal animal structures and/or animal-generated structures are used as animal structures, and/or a vegetable structure, wherein external and/or internal vegetable structures and/or vegetables-generated structures are used as vegetable structures can be formed as the bionic element.

Additively formed structures, i.e. in particular lightweight structures 12 and/or tempering channel structures and/or reinforcing structures 13 and/or bionic structures can extend in two or three dimensions, in the form of a network in some cases, through the object 2. Suitable additively formed structures can extend (only) through the interior of the object 2, so that they are not visible from the outside. Suitable structures can, in addition to their respective original function, of course also affect (further) physical properties of the object 2. This can, for example, be found in the case of a potentially three-dimensional ribbed structure inside the object 2, which on the one hand (in comparison to a solid formation) entails a reduction in material, and on the other hand entails a mechanical reinforcement of the object 2.

The method allows the object 2 to be manufactured, in particular with regard to particular load situations of the object 2, in a targeted, additive manner, i.e. in particular with additively constructed structures. The construction the object 2 is based on the prior determination of specific load regions in the reference object which, as described, are evaluated with respect to particular reference load values, i.e. are compared with corresponding reference load values. In this way it is possible—with reference to a specific load situation—for regions to be determined which are formed in a particular manner with a view to the specific load situation, i.e. for example with particular structures, i.e. in particular in an optimized manner. This can, as explained, refer, for example, to a formation of mechanical reinforcing structures and/or a formation of mechanical weakening structures, i.e. for example structures that save weight or material, and/or a formation of tempering channel structures, etc.

The object 2 is thus optimized with a view to a particular application situation or a particular load situation, which significantly improves the structural properties of the object 2 from various points of view, e.g. mechanical stability, weight etc. It is here, in particular, possible for an appropriate optimization to take place only in the interior of the object 2. The external dimensions, or the external contour, i.e. (to a large extent) the external shape of the object 2 can be retained (as compared with the reference object).

A further advantage of the method is that the objects 2 to be manufactured according to the method can be entirely additively constructed. In particular with a view to the manufacture of engineering objects, i.e. for example tool elements for injection molding tools, such as for example tool insert elements, pusher elements etc., which until now have comprised a base object body to be held ready in a store, which in future are provided with at least one object segment formed additively on the base object body ("hybrid object"), storage space, storage time, storage work etc. can be saved through the direct, additive manufacture of the object 2.

Figure 7:
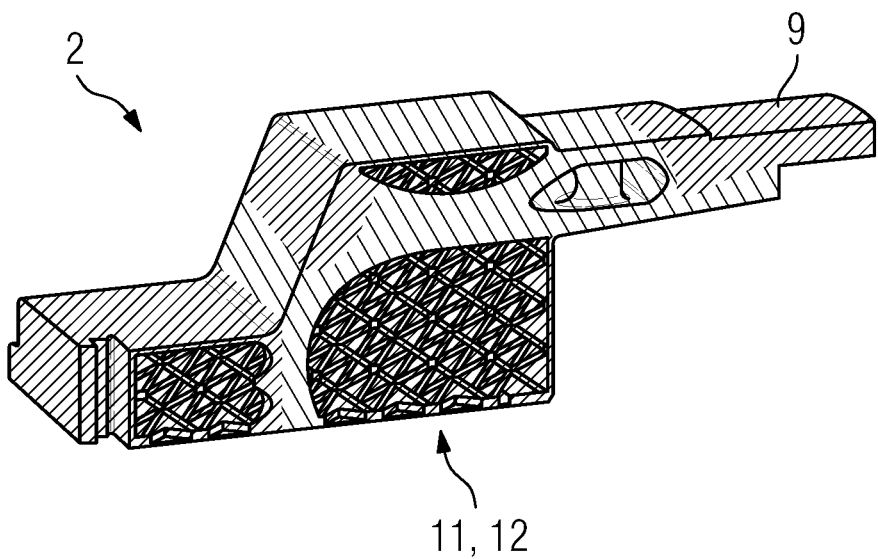

Finally, FIG. 7 shows an illustration of an FEM simulation of the object 2 that has been manufactured or is to be manufactured on the basis of the object information. The different hatchings show different loads. It can be seen that a support structure of the object 2 is loaded in a similar manner to that illustrated in FIG. 4. The lightweight structure 12 is to a large extent unloaded. The lightweight structure 12 is, however, appropriate for accepting particular loads that arise during operation of the object 2, for example when clamping the object 2 into a clamp.

With the exemplary embodiment explained with reference to FIGS. 2-7, the weight of the object 2 can be reduced by more than 50% with the same geometrically structural design and the same functionality as compared with the (solid) reference object. A further reduction in the weight of the object 2 could be achieved by adjusting particular boundary conditions.

LIST OF REFERENCE SIGNS

1 Apparatus
2 Object
3 Construction material
4 Radiation generation device
5 Energy beam
6 Beam deflection device
7 Coating device
8 Construction chamber
9 Tip
10 Object segment
11 Object segment
12 Lightweight structure
13 Reinforcing structure

The invention claimed is:

1. A method for the manufacture of a tool element for an injection molding tool, the method comprising:
  providing, to a control device, an item of reference object information describing geometrically structural data of a reference object with specified external dimensions;
  providing, to the control device, at least one item of boundary condition information describing:
    at least one geometrically structural boundary condition of the tool element; and
    at least one closed external contour of the tool element; determining an item of load information describing at least one load value in a particular load situation within the reference object described by the reference object information; determining load regions with load values deviating from a reference load value within the reference object described by the reference object information using the load information;
  determining an item of object information describing geometrically structural data of the tool element based on the load information and the boundary condition information; and
  manufacturing, with the control device, the tool element based on the object information, wherein the tool element is at least in part additively constructed and comprises:
    a main body portion comprising:
      a first region having a solid form of a first density;
      a second region with mechanical load values deviating from reference mechanical load values, the second region having a lightweight structure of a second density lower in comparison with the first density; and
      an external form corresponding to the specified external dimensions and the at least one closed external contour of the reference object in at least the first and second regions; and
    a projecting portion projecting from a face of the main body portion, the projecting portion having a tempering channel structure in a region with thermal load values deviating from reference thermal load values, wherein the tempering channel structure is configured for flowing of a tempering medium therethrough for tempering of the tool element.

2. The method of claim 1, wherein the lightweight structure comprises at least one lightweight construction element and is additively constructed through successive, selective fusing in layers of the fusible construction material by an energy beam generated by a radiation generation device, wherein the at least one lightweight construction element comprises at least one of:
- a recess;
- a sandwich structure;
- a region with a density lower in comparison with other regions of the tool element;
- a region made of a fusible construction material having a lower density in comparison with another fusible construction material of the tool element; or
- a region with thinner walls in comparison with other regions of the tool element.

3. The method of claim 1, wherein the tempering channel structure is additively constructed through successive, selective fusing in layers of the fusible construction material by an energy beam generated by a radiation generation device.

4. The method of claim 1, wherein the lightweight structure is formed in a geometrically structural design through an interior of the tool element.

5. The method of claim 1, wherein the boundary condition information describes at least one non-changeable region of the tool element in view of geometrically structural data of the reference object described by the reference object information, and the tool element is manufactured with a region corresponding to the non-changeable region described by the boundary condition information.

6. The method of claim 1, wherein the boundary condition information describes at least one of:
- a solid external region of the tool element; or
- a solid internal region of the tool element; wherein the tool element is manufactured with at least one object region corresponding to at least one region described by the boundary condition information.

7. The method of claim 1, wherein the boundary condition information describes at least one connecting region for connecting the tool element to another object.

8. The method of claim 1, wherein the tool element is a pusher element.

9. The method of claim 3, wherein the projecting portion has an additively constructed reinforcing structure in a region corresponding to regions of the reference object deviating from mechanical reference load values.

10. The method of claim 1, wherein the tool element is entirely additively constructed.

11. The method of claim 1, wherein at least one object segment of the tool element is additively constructed on a base object body to form a hybrid object.

* * * * *